United States Patent [19]

Kamperman

[11] Patent Number: 4,835,847
[45] Date of Patent: Jun. 6, 1989

[54] METHOD AND APPARATUS FOR MOUNTING A FLEXIBLE FILM ELECTRONIC DEVICE CARRIER ON A SUBSTRATE

[75] Inventor: James S. Kamperman, Endicott, N.Y.

[73] Assignee: International Business Machines Corp., Armonk, N.Y.

[21] Appl. No.: 183,948

[22] Filed: Apr. 20, 1988

[51] Int. Cl.[4] .................. H05K 3/34; B23P 19/00
[52] U.S. Cl. ................................. 29/840; 29/740; 29/827; 228/6.2
[58] Field of Search ........... 29/827, 830, 840, 740; 228/6.2

[56] References Cited

U.S. PATENT DOCUMENTS

| | | | |
|---|---|---|---|
| 2,261,015 | 10/1941 | Brody | 219/26 |
| 3,382,564 | 5/1968 | Gallentine . | |
| 3,576,969 | 5/1971 | Surty et al. | 29/827 X |
| 3,650,454 | 3/1972 | Coucoulas | 29/827 X |
| 3,699,640 | 10/1972 | Cranston et al. | 29/827 X |
| 3,700,156 | 10/1972 | Hermanns | 29/827 X |
| 3,731,867 | 5/1973 | Frisbie et al. | 29/827 X |
| 3,883,945 | 5/1975 | Wallis | 29/827 X |
| 3,990,863 | 11/1976 | Palmer . | |
| 4,295,596 | 10/1981 | Dolten et al. | 228/180 X |
| 4,528,746 | 7/1985 | Yoshimura | 29/743 |

FOREIGN PATENT DOCUMENTS

| | | | |
|---|---|---|---|
| 23599 | 2/1981 | European Pat. Off. | 228/6.2 |
| 53-26572 | 3/1978 | Japan | 29/827 |
| 54-7868 | 1/1979 | Japan | 29/830 |
| 56-37637 | 4/1981 | Japan . | |

Primary Examiner—Howard N. Goldberg
Assistant Examiner—Carl J. Arbes
Attorney, Agent, or Firm—Pollock, Vande Sande & Priddy

[57] ABSTRACT

A fixture for mounting a flexible film electronic device carrier on or for separating the carrier from a substrate which includes a body portion that has a cavity deep enough to contain an electronic device attached to the carrier, a perimeter for contact with a lead bonding area of the film, a surface having openings through which a vacuum can be drawn for holding the flexible film carrier and electronic device attached thereto in the cavity, and a heating element in the perimeter of the body portion; and use thereof to mount a carrier on to separate a carrier from a substrate.

13 Claims, 2 Drawing Sheets

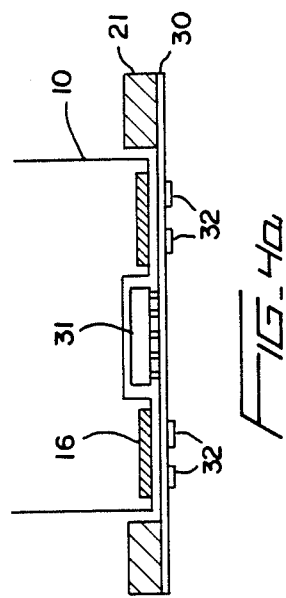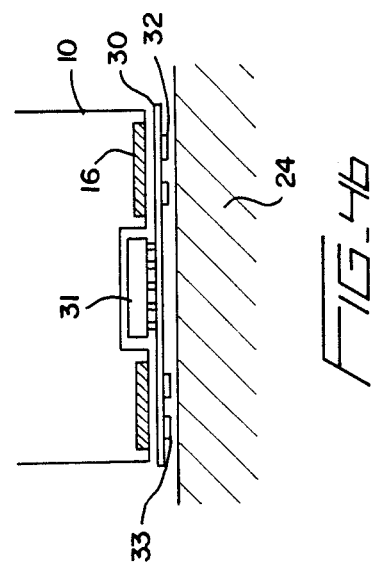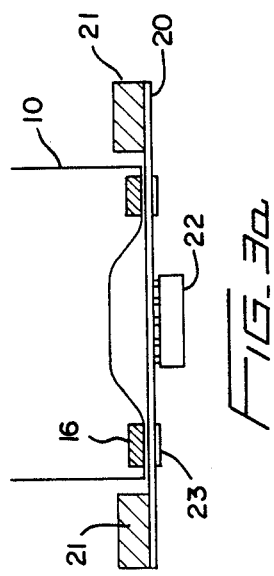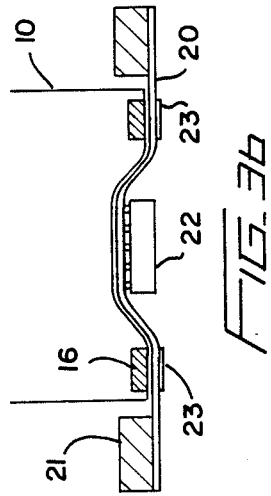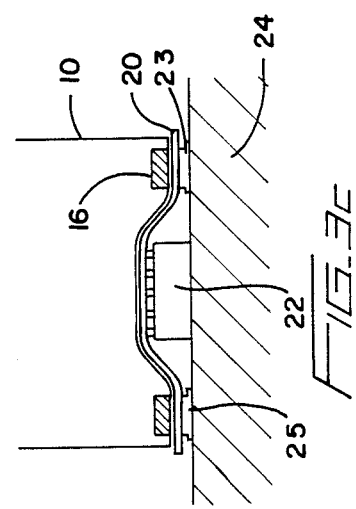

METHOD AND APPARATUS FOR MOUNTING A FLEXIBLE FILM ELECTRONIC DEVICE CARRIER ON A SUBSTRATE

DESCRIPTION

1. Technical Field

The present invention is concerned with a fixture that can be used for mounting a flexible film electronic device carrier on or for separating a flexible film electronic device carrier from a substrate. In addition, the present invention is concerned with use of the fixture to mount a flexible film electronic device carrier on a substrate and use of the fixture to separate a flexible film electronic device carrier from a substrate.

In the preferred aspects of the present invention the flexible film electronic device carrier is a flexible film semiconductor chip carrier that has mounted thereon semiconductor chip(s) and has lead bonding pads formed thereon.

2. Background Art

The fabrication of electronic packaging and especially electronic packages that employ relatively thin, flexible film carriers require careful processing. For instance, U.S. Pat. No. 4,231,154 to Gazdik, et al. discusses fabricating the types of electronic package assemblies that utilize a flexible film carrier such as a polyimide that has an electronic device mounted thereon and which is, in turn, bonded via lead bonding pads to a substrate.

The flexible film carrier with the electronic device mounted thereon is commonly referred to as a "decal". Prior to bonding the decal to the desired substrate, such as a circuit board or circuit card, the decal is produced on an individual carrier frame that supports the flexible film carrier in such a way that it can be adequately handled. The bonding is achieved by contacting lead pads of the decal to corresponding pads on the substrate and then heating in order to reflow the joint. However, in order for the bonds to be made, the leads must lie flat against the substrate. This, in turn, requires that the carrier frame be flat, that the decal be free from surface defects, and that the substrate have a recessed cavity to allow for the chips (e.g., see FIG. 1).

Because of these requirements, surface defects in the decal, substrate, or carrier frame can lead to problems in bonding which, in turn, can result in having to discard an improperly fabricated product. In addition, it is necessary to carefully handle the decals to prevent damage to the decals because they are extremely thin and very flexible.

In addition, removal of a defective flexible film device carrier or electronic device from a substrate such as a integrated circuit board or integrated circuit card in order to be able to reuse the board or card is quite difficult. For instance, the tenacity of the bond between the carrier and substrate and the flexible nature of the carrier makes it difficult to adequately handle the package to remove the carrier and device in its entirely from the card or board without causing damage to the card or board, which would render it unsuitable for reuse.

In addition, the prior fabrication methods require that the frame remain with the flexible film carrier until after the bond with the substrate is achieved and then separated therefrom. However, this sequence is not entirely desirable because of the restriction placed upon the shape of the decal and substrate as illustrated in FIG. 1. Also, the prior fabrication techniques are suitable only for producing the devices on an individual basis.

SUMMARY OF INVENTION

The present invention makes it possible to remove the support frame from the flexible film electronic device carrier prior to the bonding with the substrate. In addition, the present invention makes it possible to employ a planar substrate as contrasted to the substrates that require a recessed cavity to allow for the chips as experienced in the prior art. Also, the present invention can tolerate surface defects in the decal as well as deviations from planarity of the support frame.

In addition, the ability to remove the decal from the support frame prior to the bonding eliminates the need for a second, stress-relieving reflow and thereby improves the economics of the process. Also, the prevent invention makes it possible to handle the devices automatically and to produce decals on a multiup fashion.

The fixture aspect of the present invention is concerned with a fixture for mounting a flexible, thin electronic device carrier on or for separating a flexible film electronic device carrier from a substrate. The fixture comprises a body portion that has a recessed cavity which is deep enough to receive or contain an electronic device that is attached to a flexible film carrier. The perimeter of the body portion of the fixture is for contact with lead bonding area of the flexible film. The fixture includes a surface that contains openings through which a vacuum can be established for holding or maintaining the flexible film electronic device carrier and electronic device attached thereto secure in the cavity. A heating element is provided in the perimeter of the body portion. The heating element is for reflow or thermal compression of the lead bonding pads.

In addition, the present invention is concerned with a method for mounting a flexible film electronic device carrier onto a substrate.

The method comprises obtaining a flexible film electronic device carrier in a support frame with an electronic device mounted on a flexible film electronic device carrier. In addition, the carrier has lead bonding pads thereon.

The flexible film electronic device carrier is placed in contact with a fixture of the type discussed above. A vacuum is then drawn through the fixture to hold the carrier in its desired position. The support frame is removed from the flexible film electronic device carrier. The flexible film electronic device carrier is placed in contact with a substrate to which the carrier is to be connected. The lead bonding areas of the electronic device carrier are heated to melt the material thereof for contact with corresponding areas on the substrate and, upon cooling down, to bond the carrier to the substrate. After bonding of the carrier to the substrate, the vacuum is released and the desired device of the flexible film electronic device carrier mounted on the substrate is obtained.

Another process aspect of the present invention is for removing a flexible film electronic device carrier from a substrate to which the carrier has been bonded. The carrier has mounted on it an electronic device and has lead bonding pads that bound the carrier to the substrate.

The process for removal includes placing the flexible film electronic device carrier in contact with a fixture of the type discussed above. A vacuum is drawn through the fixture to hold the flexible film carrier in a desired position. The lead bonding areas of the flexible film electronic device carrier are heated to cause melting of the material of the bonding pads. The fixture is raised to separate the carrier from the substrate. The vacuum is then released.

BRIEF DESCRIPTION OF DRAWINGS

FIGS. 3a–3c and FIGS. 4a and 4b are schematic diagrams illustrating the use of the fixture of the present invention for mounting a carrier onto a substrate.

BEST AND VARIOUS MODES FOR CARRYING OUT INVENTION

To facilitate understanding of the present invention, the following description is presented with reference to the drawings.

Figure 1:
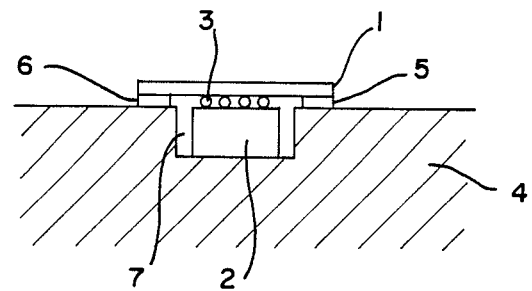
FIG. 1 is a schematic diagram of the configuration of prior art electronic packaging.

Reference to FIG. 1 illustrates the prior art configuration in providing a decal containing a semiconductor chip onto a supporting substrate. In particular, decal (1) containing chip (2) bonded thereto by solder bond (3) is bonded to substrate (4) by contacting pads (5) of the decal to corresponding pads (6) of the substrate. The decal and substrate are then heated to reflow the joint. As illustrated, the leads must lie flat against the substrate which requires that the carrier frame for the decal be flat, that the decal be free from surface defects, and that the substrate have a recessed cavity (7) to allow for receiving the chip.

Figure 2:
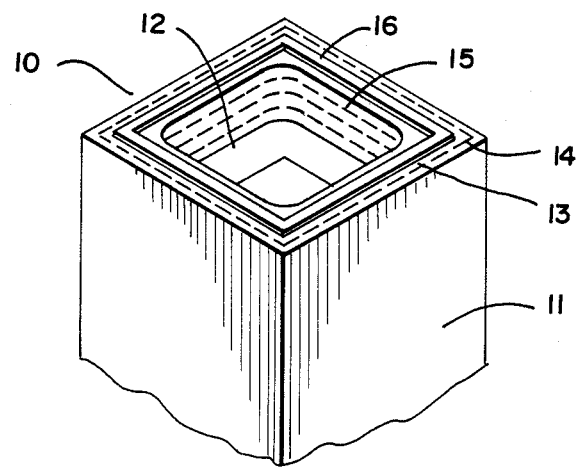
FIG. 2 is an isometric view of the fixture of the present invention.

FIG. 2 is a schematic of a fixture in accordance with the present invention. The fixture (10) includes walls (11) made of any suitable structural material such as fritted bronze. Fixture (10) includes a recess (12) within the vicinity of the center portion of the fixture. Recessed cavity (12) is deep enough to receive a semiconductor chip. The surface (13) of fixture (10) is substantially planar and contains holes (14) that permit a vacuum to be pulled against a decal to be subsequently placed therein. The vacuum will maintain the decal in place. Holes (15) are also provided within the interior around the outer periphery of the fixture to further facilitate the providing of a vacuum. Instead of holes (14, 15), the fixture can be constructed of porous material that would provide the means to pull the vacuum. Within the vicinity of the perimeter of the surface of the fixture is a heating element (16). The heating element (16) provides for heating the leads to bond the decal to the substrate or to soften the bond of an already formed device in order to remove the film from the substrate.

Reference to FIGS. 3a–3c illustrate use of the fixture of the present invention for mounting a flexible film electronic device carrier on a substate. In particular, FIG. 3a illustrates fixture (10) in inverted form whereby a flexible film electronic device carrier (20) in a support frame (21) with an electronic device (22) mounted on the flexible film electronic device carrier (20) is located beneath the fixture (10). The carrier also includes lead bonding pads (23). The surface of the carrier (20) that is remote from the electronic device (22) is placed facing the fixture (10) for contact therewith. A vacuum is applied pulling the flexible device carrier or decal to thereby form it whereby the electronic device such as the chip is maintained within the cavity of the fixture. A die not shown then is used to remove the support frame from the flexible film carrier. If desired, in order to accurately align the decal (20) to the substrate (24) (see FIG. 3c), an optical system (not shown) known in the art, such as a split optics system, can be employed. The fixture then presses the decal (20) to the substrate (24) while heat is applied via the heat coil (16) in the perimeter of the fixture to the respective lead bonding areas (23 and 25) of the carrier and substrate (24) to thereby bond the carrier to the substrate. The heat reflows the solder, forming a strong bond between the substrate and the carrier. The electronic device (22) being in contact with the substrate (24). Next, the vacuum is released and the fixture is retracted. The decal mounted and bonded to the substrate is thereby obtained.

Typical solders are Pb-Sn solders such as a 63% Sn-37% Pb that melts at about 185° C. and 10% Sn-90% Pb that melts at about 320° C.

FIGS. 4a and 4b illustrate a fixture of the present invention being used with a double-sided chip carrier (30). In particular, FIG. 4a illustrates fixture (10) in inverted form whereby a flexible film electronic device carrier (30) in a support frame (21) with an electronic device (31) mounted on the flexible film electronic device carrier (20) is located beneath the fixture (10). The carrier also includes lead bonding pads (32). The surface of the carrier (30) that is closest the electronic device (31) is placed facing the fixture (10) for contact therewith. A vacuum is applied pulling the flexible device carrier or decal to thereby form it whereby the electronic device such as the chip is maintained within the cavity of the fixture. A die not shown then is used to remove the support frame from the flexible film carrier. If desired, in order to accurately align the decal (30) to the substrate (24) (see FIG. 4b), an optical system (not shown) known in the art, such as a split optics system, can be employed. The fixture then presses the decal (20) to the substrate (24) while heat is applied via the heat coil (16) in the perimeter of the fixture to the respective lead bonding areas (32 and 33) of the carrier and substrate (24) to thereby bond the carrier to the substrate. The heat reflows the solder, forming a strong bond between the substrate and the carrier. The electronic device (22) being in contact with the substrate (24). Next, the vacuum is released and the fixture is retracted. The decal mounted and bonded to the substrate is thereby obtained.

In addition, the fixture of the present invention can be employed to remove a flexible film electronic device carrier from a substrate to which the carrier is bonded. This may be desirable when a defective device is discovered so that the substrate after removal from the carrier can be reused. The process includes placing the flexible film electronic device carrier in contact with a fixture pursuant to the present invention whereby the substrate bonded to the carrier is remote from the fixture. A vacuum is then drawn through the fixture to hold the flexible film electronic device carrier in its desired position. The lead bonding area of the flexible film carrier is heated by the heating element in the perimeter of the fixture to cause melting of the material of the bonding pads. The fixture is then raised to separate the carrier from the substrate and then the vacuum is released.

The decals or electronic device carriers that can be employed pursuant to the present invention are, for example, those disclosed in U.S. Pat. No. 4,231,154 to Gazdik, et al., disclosure of which is incorporated herein by reference. In particular, the preferred flexible carriers are thin polyimide substrates generally having a thickness of about 0.5 microns to about 50 microns and preferably about 5 to about 10 microns. The support frame is generally a relatively rigid material such as titanium or the like. The substrates to which the polyimide and chip are connected are generally rigid substrates such as ceramic materials and epoxy circuit boards, as well as flexible films such as polyimides.

Having thus described our invention, what we claim as new and desire to secure by Letters Patent is:

1. A method for mounting a flexible film electronic device carrier on a substrate which comprises:
    (a) obtaining a flexible film electronic device carrier in a support frame with an electronic device mounted on said flexible film electronic device carrier and having lead bonding pads formed on the flexible film electronic device;
    (b) placing said flexible film electronic device carrier in contact with a fixture wherein said electronic device is maintained within a cavity of said fixture, and wherein said fixture has a heating element for contact with the lead bonding area of said flexible film electronic device carrier, and a surface having openings through which a vacuum can be drawn;
    (c) drawing a vacuum through said fixture to hold said flexible film electronic device carrier in desired position;
    (d) then removing said support frame from said flexible film electronic device carrier;
    (e) placing said flexible film electronic device carrier in contact with a substrate to which said carrier is to be connected;
    (f) heating the lead bonding area of the flexible film electronic device carrier to bond said carrier to said substrate; and
    (g) releasing said vacuum and thereby obtaining the flexible film electronic device carrier mounted on said substrate.

2. The method of claim 1 wherein said carrier is a film having a thickness of about 0.5 to about 50 microns.

3. The method of claim 2 wherein said carrier is a polyimide.

4. The method of claim 1 wherein said device is an integrated circuit chip.

5. The method of claim 1 wherein said substrate is a ceramic or epoxy circuit board.

6. The method of claim 1 wherein the outer periphery of said cavity includes openings around it through which said vacuum can be drawn and wherein the perimeter of said surface has openings around it through which a vacuum can be drawn.

7. A method for removing a flexible film electronic device carrier from a substrate to which said carrier is bonded; said carrier having mounted on one major surface thereof an electronic device and having lead bonding pads that bound the carrier to the substrate and wherein the electronic device contacts said substrate; which process comprises:
    (a) placing said flexible film electronic device carrier in contact with a fixture whereby the electronic device is provided within a cavity of said fixture;
    (b) said fixture having a body portion sized and configured to the bonding configuration of the carrier to the substrate, and having a heating element for contact with the lead bonding area of the flexible film electronic device carrier and a surface having openings through which a vacuum can be drawn;
    (c) drawing a vacuum through said fixture to hold said flexible film electronic device carrier in desired position;
    (d) heating the lead bonding area of the flexible film electronic device carrier to bond said carrier to said substrate;
    (e) raising said fixture to separate said flexible film electronic device carrier from the substrate; and then releasing said vacuum.

8. The method of claim 7 wherein said carrier is a film having a thickness of about 0.5 to about 50 microns.

9. The method of claim 8 wherein said carrier is a polyimide.

10. The method of claim 7 wherein said device is an integrated circuit chip.

11. The method of claim 7 wherein said substrate is a ceramic or epoxy circuit board.

12. The method of claim 7 wherein the outer periphery of said cavity includes openings around it through which said vacuum can be drawn and wherein the perimeter of said surface has openings around it through which a vacuum can be drawn.

13. A fixture for mounting a flexible film electronic device carrier on or for separating a flexible film electronic device carrier from a substrate which comprises:
    a body portion having a recessed cavity deep enough to contain an electronic device attached to a flexible film carrier with the surface of the cavity for contact with the flexible film carrier, and the perimeter of the body portion for contact with a lead bonding area of the flexible film, the perimeter of said body portion including openings around it through which a vacuum can be established and the outer periphery of said cavity including openings around it through which a vacuum can be established for holding the flexible film carrier and electronic device attached thereto in the cavity; and
    a heating element in the perimeter of the body portion.

* * * * *